(12) United States Patent
Yamazawa

(10) Patent No.: US 8,157,953 B2
(45) Date of Patent: Apr. 17, 2012

(54) PLASMA PROCESSING APPARATUS

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 11/692,363

(22) Filed: Mar. 28, 2007

(65) Prior Publication Data

US 2007/0227662 A1    Oct. 4, 2007

Related U.S. Application Data

(60) Provisional application No. 60/791,465, filed on Apr. 13, 2006.

(30) Foreign Application Priority Data

Mar. 29, 2006    (JP) .................................. 2006-091406

(51) Int. Cl.
    *C23F 1/00*    (2006.01)
    *H01L 21/306*    (2006.01)
    *C23C 16/00*    (2006.01)

(52) U.S. Cl. ......... 156/345.44; 156/345.43; 156/345.47; 156/345.51; 118/723 E

(58) Field of Classification Search .................. 118/722, 118/723 R, 723 I, 728; 156/345.33, 345.34, 156/345.43, 345.47, 345.48, 345.51, 45.45
See application file for complete search history.

(56) References Cited

U.S. PATENT DOCUMENTS

| | | | |
|---|---|---|---|
| 5,665,166 A * | 9/1997 | Deguchi et al. ............ | 118/723 E |
| 5,919,332 A * | 7/1999 | Koshiishi et al. ......... | 156/345.47 |
| 6,095,084 A * | 8/2000 | Shamouilian et al. ..... | 118/723 E |
| 6,245,190 B1 * | 6/2001 | Masuda et al. ........... | 156/345.46 |
| 6,367,413 B1 * | 4/2002 | Sill et al. .................... | 118/723 E |
| 6,478,924 B1 * | 11/2002 | Shamouilian et al. ... | 156/345.48 |
| 6,642,149 B2 * | 11/2003 | Suemasa et al. .............. | 438/710 |
| 2004/0134616 A1 * | 7/2004 | Sago et al. ............... | 156/345.47 |
| 2005/0061445 A1 | 3/2005 | Koshiishi et al. | |
| 2005/0257743 A1 * | 11/2005 | Koshiishi et al. ......... | 118/723 E |
| 2005/0276928 A1 * | 12/2005 | Okumura et al. ............. | 427/446 |

FOREIGN PATENT DOCUMENTS

| | | |
|---|---|---|
| JP | 2000-156370 | 6/2000 |
| JP | 2000-323456 | 11/2000 |
| JP | 2004-363552 | 12/2004 |
| WO | WO 2004049420 A1 * | 6/2004 |

\* cited by examiner

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

In a plasma processing apparatus including a vacuum-evacuable processing chamber, a first lower electrode for supporting a substrate to be processed thereon is disposed in the processing chamber and an upper electrode is disposed above the first lower electrode to face the first lower electrode. Further, a second lower electrode is disposed under the first lower electrode while being electrically isolated from the first lower electrode. A processing gas supply unit supplies a processing gas into a space between the upper electrode and the first lower electrode. A first high frequency power supply unit applies a first high frequency power of a first frequency to the first lower electrode, and a second high frequency power supply unit applies a second high frequency power of a second frequency higher than the first frequency to the second lower electrode.

18 Claims, 3 Drawing Sheets

PLASMA PROCESSING APPARATUS

FIELD OF THE INVENTION

The present invention relates to a technique for performing a plasma etching on a substrate to be processed; and, more particularly, to a capacitively coupled plasma processing apparatus of a type in which dual high frequency powers of different frequencies are applied to an electrode.

BACKGROUND OF THE INVENTION

In a manufacturing process of semiconductor devices or flat panel displays (FPDs), a plasma is used to perform a micro-processing, such as etching, deposition, oxidation, sputtering or the like, so as to obtain a good reaction of a processing gas at a relatively low temperature. Conventionally, a capacitively coupled type plasma apparatus has been widely employed as a single-wafer plasma processing apparatus, especially, as a single-wafer plasma etching apparatus.

Generally, in the capacitively coupled plasma processing apparatus, an upper electrode and a lower electrode are disposed to face each other in parallel in a vacuum processing chamber, a substrate to be processed (a semiconductor wafer, a glass substrate or the like) is mounted on the upper electrode, and a high frequency power is applied to either one of the upper and the lower electrode. Electrons are accelerated by an electric field formed by the high frequency power to collide with a processing gas. As a result of ionization by the collision between the electrons and the processing gas, a plasma is generated, and a desired microprocessing (for example, etching) is performed on the surface of the substrate by radicals or ions in the plasma.

With a recent trend of miniaturization of design rules for the manufacturing process, a high-density plasma is required to be available at a low pressure for a plasma processing, and the aforementioned capacitively coupled plasma processing apparatus uses a high frequency in a frequency range (40 MHz or greater) much higher than a conventional frequency level (13.56 MHz, in general). However, if a frequency of a high frequency discharge is high, a high frequency power applied from a high frequency power supply to a rear surface or a backside surface of an electrode via a power supply rod is made to propagate to an electrode main surface (which faces a plasma) by a skin effect, whereby a high frequency current is made to flow on the electrode main surface from an edge portion toward a central portion thereof. Accordingly, an electric field intensity at the central portion of the electrode main surface becomes higher than that at the edge portion thereof, so that a density of a plasma generated at the central portion of the electrode becomes greater than that at the edge portion thereof. As a result, there occurs a problem that process characteristics become nonuniform in a radial direction.

To solve the problem, there have been made many researches including one that proposes forming flowerpot-shaped or tapered recesses on a main surface of an electrode to which a high frequency power is applied and burying a dielectric material in the recesses (see, for example, Japanese Patent Laid-open Publication No. 2004-363552 and U.S. Patent Application Publication No. 2005-276928). In such a configuration of the electrode, an impedance of a central portion of the electrode is greater than that of a plasma side, while an impedance of an edge portion of the electrode is smaller than that of the plasma side. Accordingly, a high frequency electric field at the edge portion of the electrode becomes increased, while that at the central portion of the electrode is weakened. As a result, the aforementioned non-uniform distributions of electric field intensity and plasma density can be ameliorated. Further, there has been also proposed an electrode structure with a high-resistance member disposed at a central portion of the electrode, but this structure results in an increase of power consumption due to a Joule heat (see, for example, Japanese Patent Laid-open Publication No. 2000-323456 and U.S. Patent Application Publication No. 2005-61445).

Meanwhile, as for the capacitively coupled plasma processing apparatus, a type that applies dual frequency powers to a lower electrode supporting a target substrate thereon is mainly used in recent years to optimize a plasma density and a selectivity of anisotropic etching individually. In the apparatus of this type, a first high frequency power of a comparatively high frequency (27 MHz or greater in general) suitable for plasma generation and a second high frequency of a comparatively low frequency (13.56 MHz or less in general) suitable for ion attraction are applied to the lower electrode concurrently (see, for example, Japanese Patent Laid-open Publication No. 2000-156370 and U.S. Pat. No. 6,642,149).

In the conventional plasma processing apparatus wherein two high frequency powers are applied to the lower electrode, in case the apparatus uses a high frequency range (40 MHz or greater) for plasma generation and employs the lower electrode structure in which the impedance of the central portion of the electrode is set to be relatively higher than that at the edge portion thereof by burying a dielectric material or a high-resistance member as described above, a uniformity of an electric field intensity distribution on the main surface (top surface) of the lower electrode improves for the high frequency power of the high frequency for plasma generation. However, for the high frequency power of the low frequency for ion attraction, an electric field intensity at the central portion of the lower electrode becomes lower than that at the edge portion thereof, which results in a deterioration of the uniformity of the electric field intensity distribution. Thus, there is a trade-off problem that a uniformity of anisotropic etching accuracy is deteriorated while the uniformity of the plasma density can be improved.

SUMMARY OF THE INVENTION

It is, therefore, an object of the present invention to provide a capacitively coupled plasma processing apparatus capable of optimizing function or action of dual high frequency powers of different frequencies applied to one of electrodes (particularly, a lower electrode) concurrently.

In particular, the present invention provides a plasma processing apparatus capable of improving efficiency and accuracy of a plasma processing by independently controlling electric field intensity distributions of respective high frequency powers for plasma generation and for ion attraction in a type in which dual frequency powers are applied to a lower electrode.

In accordance with an aspect of the present invention, there is provided a plasma processing apparatus including: a vacuum-evacuable processing chamber; a first lower electrode for supporting a substrate to be processed thereon in the processing chamber; an upper electrode disposed above the first lower electrode to face the first lower electrode; a second lower electrode disposed under the first lower electrode, the second lower electrode being electrically isolated from the first lower electrode; a processing gas supply unit for supplying a processing gas into a space between the upper electrode and the first lower electrode; a first high frequency power supply unit for applying a first high frequency power of a first frequency to the first lower electrode; and a second high frequency power supply unit for applying a second high frequency power of a second frequency higher than the first frequency to the second lower electrode.

In such arrangements, a lower electrode is divided into the first and the second lower electrode vertically, the first high frequency power of a relatively low frequency is applied to the first lower electrode and the second high frequency power of a relatively high frequency is applied to the second lower electrode, so that the first and the second lower electrode can be made to have optimal electrode structures suitable for functions of the first and the second high frequency power, respectively.

Preferably, the second lower electrode is provided with a recess in a top surface thereof, and a dielectric material is filled in the recess. In this case, it is preferable that the thickness of the dielectric material is gradually reduced from a central portion of the second lower electrode toward an edge portion thereof. With such arrangements, in case the second high frequency power is set to be considerably high for increasing a plasma density, a skin effect at the second lower electrode is canceled, so that a high frequency electric field due to the second high frequency power is made uniform in a radial direction of the electrode and the plasma density in the plasma space is made uniform in the electrode radial direction.

Typically, in a case where a high frequency is discharged into the plasma space from the second lower electrode, a magnetic field generated by a vortex current flowing in the first lower electrode functions to prevent a straight movement of the high frequency from the second lower electrode. To that end, in order to suppress the vortex current in the first lower electrode, the first lower electrode is preferably formed with a high-resistivity material. Further, since the first high frequency power functioning to attract ions to the substrate to be processed has a relatively low frequency, the skin effect in the first lower electrode becomes small. Accordingly, there is not required a special electrode structure for the first lower electrode and, typically, a flat plate electrode made of a single material to have a constant thickness can be used as the first lower electrode.

Further, for prevention of discharge, a gap between the first lower electrode and the second lower electrode is preferably filled with an insulator. The second lower electrode may be formed to have a ring shape.

In accordance with another aspect of the present invention, there is provided a plasma processing apparatus including: a vacuum-evacuable processing chamber; a first electrode disposed in the processing chamber to face a plasma space; a second electrode disposed at a rear side of the first electrode when viewed from the plasma space; a processing gas supply unit for supplying a processing gas into the plasma space; a first power supply unit for applying a first high frequency power or a direct current to the first electrode; and a second power supply unit for applying a second high frequency power to the second electrode. In a case where a direct current is applied to the first electrode, a third electrode may be disposed opposite to the first electrode in parallel thereto with the plasma space present therebetween.

In accordance with the present invention, as described above, in a capacitively coupled plasma processing apparatus of a type in which two high frequency powers of different frequencies are applied to one of electrodes (particularly, a lower electrode), the electrode is vertically divided into two and the high frequency powers are individually applied to the respective divided electrodes. Accordingly, functions or actions of dual high frequency powers can be concurrently optimized. Particularly, in a type in which dual frequency powers are applied to a lower electrode, it is possible to improve efficiency and accuracy of a plasma processing by independently controlling electric field intensity distributions of respective high frequency powers for plasma generation and for ion attraction.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described with reference to the accompanying drawings.

Figure 1:
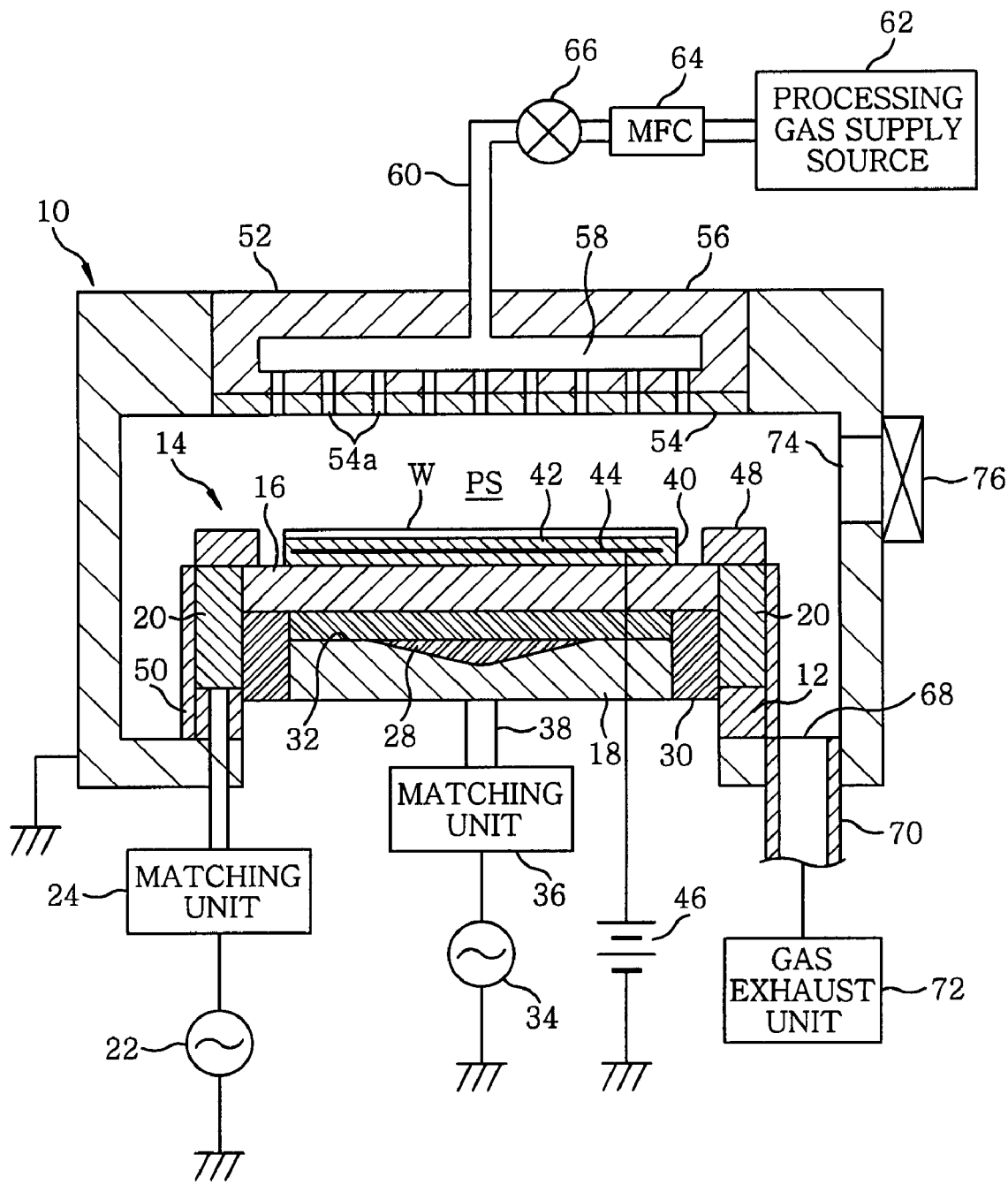
FIG. 1 is a cross sectional view showing a plasma etching apparatus in accordance with an embodiment of the present invention.

FIG. 1 illustrates a configuration of a plasma etching apparatus in accordance with a first embodiment of the present invention. The plasma etching apparatus is configured as a capacitively coupled plasma processing apparatus of a type that applies dual frequency powers to a lower electrode. The plasma etching apparatus has a cylindrical chamber (processing chamber) 10 made of a metal such as aluminum or stainless steel, and the chamber 10 is frame grounded.

A susceptor 14 serving as a lower electrode and a substrate supporting table is disposed at a bottom portion in the chamber 10 via an annular insulating member 12 made of, e.g., ceramic. The susceptor 14 has an upper susceptor electrode 16 and a lower susceptor electrode 18 serving as a first and a second lower electrode, respectively.

On the annular insulating member 12, there is provided an annular or a cylindrical power feeder 20, and the upper susceptor electrode 16 is attached to the upper portion of the power feeder 20 substantially horizontally. The upper susceptor electrode 16 is a circular flat plate electrode having a diameter larger than that of a substrate to be processed, e.g., a semiconductor wafer W. The upper susceptor electrode 16 is preferably formed of a conductive material having a high resistivity, e.g., tungsten (W) or silicon (Si), for a reason to be explained later. The power feeder 20 is made of a low-resistivity material suffering a little transmission loss, e.g., aluminum.

A first high frequency power supply 22 is connected to the upper susceptor electrode 16 via a matching unit 24, a power supply rod 26 and the power feeder 20. The first high frequency power supply 22 outputs a first high frequency power of a specific frequency of, e.g., about 2 MHz which mainly contributes to an ion attraction to the semiconductor wafer W which is held on the susceptor 14. The first high frequency power (about 2 MHz) from the first high frequency power supply 22 is supplied to the upper susceptor electrode 16 via the matching unit 24, the power supply rod 26 and the power feeder 20 and then discharged into a plasma space PS above a main surface (top surface) of the upper susceptor electrode 16.

The lower susceptor electrode 18 is a substantially flat plate electrode of a circular shape formed of a conductive material having a low resistivity, e.g., aluminum. The lower susceptor electrode 18 is disposed inside the annular insulating member 12 to be located directly below the upper susceptor electrode 16, while being electrically isolated from the ambient elements 16 and 20. As shown in FIG. 1, the lower susceptor electrode 18 is provided with a tapered recess converged toward the center of the electrode 18 on its main surface (top surface), and a dielectric material 28 is filled in the recess. This electrode structure is designed to improve uniformities of an electric field intensity and a plasma density in an electrode diametric direction, and the technique related to this structure is disclosed in Japanese Patent Laid-open Publication No. 2004-363552. Preferably, gaps between the lower susceptor electrode 18, the annular insulating member 12 and the upper susceptor electrode 16 are filled with a cylindrical insulator 30 and a disk-shaped insulator 32 made of, e.g., ceramic to prevent an electric discharge.

A second high frequency power supply 34 is connected to the lower susceptor electrode 18 via a matching unit 36 and a power supply rod 38. The second high frequency power supply 34 outputs a second high frequency power of a specific frequency of, e.g., about 40 MHz which mainly contributes to a plasma generation. The second high frequency power (about 40 MHz) from the second high frequency power supply 34 is supplied to the lower susceptor electrode 18 via the matching unit 36 and the power supply rod 38 and then discharged toward the plasma space PS above the main surface (top surface) of the lower susceptor electrode 18.

On the top surface of the upper susceptor electrode 16, there is disposed an electrostatic chuck 40 for attracting and holding the semiconductor wafer with an electrostatic adsorptive force. The electrostatic chuck 40 includes an electrode 44 formed of a conductive film which is inserted between a pair of insulating layers or sheets 42. A DC power supply 46 is connected to the electrode 44. The electrostatic chuck 40 is allowed to attract and hold the semiconductor wafer W thereon with a Coulomb force generated by a DC voltage applied from the DC power supply 46 thereto. A focus ring 48 made of, e.g., silicon is disposed to surround the electrostatic chuck 40 to improve an etching uniformity. Further, an inner wall member 50 made of, e.g., quartz is attached to the outer peripheries of the annular insulating member 12 and the cylindrical power feeder 20.

To control the temperature of the semiconductor wafer W loaded on the susceptor 14, a coolant chamber or a coolant path (not shown) may be formed inside the upper susceptor electrode 16 to circulate a coolant, e.g., cooling water, of a specific temperature supplied from an external chiller unit (not shown). Likewise, to control the temperature of the semiconductor wafer W, a thermally conductive gas, e.g., He gas, may be supplied into a gap between the top surface of the electrostatic chuck and the backside of the semiconductor wafer W from a thermally conductive gas supply unit (not shown) via a gas supply line (not shown).

A shower head 52 also serving as an upper electrode of a ground potential is installed at a ceiling portion of the chamber 10, facing the susceptor 14 in parallel. The shower head 52 has, at its bottom surface, an electrode plate 54 provided with a number of gas injection openings 54a; and an electrode support 56 for holding the electrode plate 54 detachably. The electrode plate 52 is made of, e.g., Si or SiC, while the electrode support 56 is formed of, e.g., alumite-treated aluminum. Provided inside the electrode support 56 is a gas chamber 58 connected to a processing gas supply source 62 via a gas supply line 60. A mass flow controller (MFC) 64 and a valve 66 are installed on the gas supply line 60. A processing gas is supplied into the gas chamber 58 from the processing gas supply source 62 and then is injected into the chamber 10 toward the semiconductor wafer W on the susceptor 14 through the gas injection openings 54a of the electrode plate 54 in a shower-like manner.

An annular space formed between the susceptor 14 and the sidewall of the chamber 10 is configured as a gas exhaust space, and a gas exhaust opening 68 is provided at a bottom portion of the gas exhaust space. Further, a gas exhaust unit 72 is connected to the gas exhaust opening 68 via a gas exhaust line 70. The gas exhaust unit 72 has a vacuum pump such as a turbo molecular pump and it functions to depressurize the inside of the chamber 10, especially the plasma space therein to a desired vacuum level. Further, a gate valve 76 for opening and closing a loading/unloading port 74 for the semiconductor wafer is installed at a sidewall of the chamber 10.

In the plasma etching apparatus, in order to perform an etching process, the gate valve 76 is opened and a semiconductor wafer W to be processed is loaded into the chamber 10 to be mounted on the electrostatic chuck 40. Then, a specific processing gas, i.e., an etching gas (generally, a gaseous mixture) is supplied into the chamber 10 from the processing gas supply source 62 at a specified flow rate and flow rate ratio, while the chamber 10 is evacuated by the gas exhaust unit 72 such that the internal pressure of the chamber 10 is maintained at a specific vacuum level. Further, a first high frequency power of a frequency of about 2 MHz is applied to the upper susceptor electrode 16 from the first high frequency power supply 22, and, at the same time, a second high frequency power of a frequency of about 40 MHz is applied to the lower susceptor electrode 18 from the second high frequency power supply 34. Further, a DC voltage is applied to the electrode 42 from the DC power supply 46, whereby the semiconductor wafer W is firmly fixed on the electrostatic chuck 40. The etching gas injected from the upper electrode, i.e., the shower head 52 is converted into a plasma by a high frequency discharge in the plasma space PS, and films formed on the main surface of the semiconductor wafer W are etched by radicals or ions present in the plasma.

In the above-described capacitively coupled plasma etching apparatus, by applying the second high frequency power of a relatively high frequency, about 40 MHz, suitable for plasma generation to the lower susceptor electrode 18 of the susceptor 14, a high-density plasma in a desirable dissociation state can be generated even at a relatively low pressure level. Further, by applying the first high frequency power of a relatively low frequency, about 2 MHz, for ion attraction, to the upper susceptor electrode 16 of the susceptor 14, an anisotropic etching can be performed on the semiconductor wafer W on the susceptor 14 with a high selectivity.

Now, a function of the susceptor 14, which is an inventive element of the plasma etching apparatus in accordance with the embodiment of the present invention, will be described in detail.

As described above, the susceptor 14 is divided into the upper susceptor electrode 16 and the lower susceptor electrode 18, wherein the first high frequency power of about 2 MHz is applied to the upper susceptor electrode 16 from the first high frequency power supply 22, while the second high frequency power of about 40 MHz is applied to the lower susceptor electrode 18 from the second high frequency power supply 34.

Here, the upper susceptor electrode 16 is a flat plate electrode made of a single material and having a specific thickness. When a first high frequency current of the relatively low frequency (about 2 MHz) flows on the main surface of the upper susceptor electrode 16, a surface thickness thereof is thick (that is, a skin effect is low) and the current is discharged into the plasma space PS substantially uniformly from every position on the main surface of the electrode 16 without being concentrated at the central portion thereof. Accordingly, the intensity distribution of a high frequency electric field formed above the susceptor 14 by the first high frequency power of about 2 MHz can be made substantially uniformly in a radial direction of the electrode 16. As a result, the amount of the ions incident on the semiconductor wafer W along the high frequency electric field can be made uniform over the entire surface of the wafer W, whereby an in-surface uniformity of an anisotropic etching profile or selectivity can be improved.

Meanwhile, the lower susceptor electrode 18 is provided with the tapered recess at its main surface and the recess is filled with the dielectric material 28, as described above. Such arrangements function to prevent a second high frequency current of a considerably high frequency (about 40 MHz), which has a thin surface thickness (that is, a high skin effect), from being concentrated at the central portion of the electrode 18. Accordingly, the current can be discharged into the plasma space PS substantially uniformly from every position on the main surface of the electrode 18. As a result, the intensity distribution of a high frequency electric field formed on the susceptor 14 by the second high frequency power of about 40 MHz can be made substantially uniform in a radial direction of the electrode 18. Thus, it is possible to make uniform the magnitude of a high frequency current or electron current, which is accelerated by the high frequency electric field to collide with gas molecules in the plasma space PS, and the plasma density just above the wafer W, so that an in-surface uniformity of etching rates can be improved.

Typically, when the high frequency current is discharged into the plasma space PS from the lower susceptor electrode 18, a magnetic field formed by a vortex current flowing in the upper susceptor electrode 16 prevents a straight movement of the high frequency current from the lower susceptor electrode 18. In this embodiment of the present invention, however, by forming the upper susceptor electrode 16 with a high-resistivity material, the vortex current is suppressed, so that the influence of the upper susceptor electrode 16 upon the high frequency current discharged from the lower susceptor electrode 18 toward the plasma process PS can be diminished.

While the present invention has been described by taking the embodiment as an example, it is to be noted that the present invention can be modified in various ways without being limited to the above-described embodiment.

For instance, the structure of the lower susceptor electrode 18 in the above embodiment has been described for illustrative purpose only, and the lower susceptor electrode 18 may have various electrode structures as disclosed in Japanese Patent Laid-open Publication No. 2004-363552 and the like to improve the electric field intensity or the plasma density in a diametric direction of the electrode 18. In particular, since the lower susceptor electrode 18 is provided independently from the upper susceptor electrode 16 in the present invention, it is possible to make the application of the electrode structure more flexible.

Figure 2:
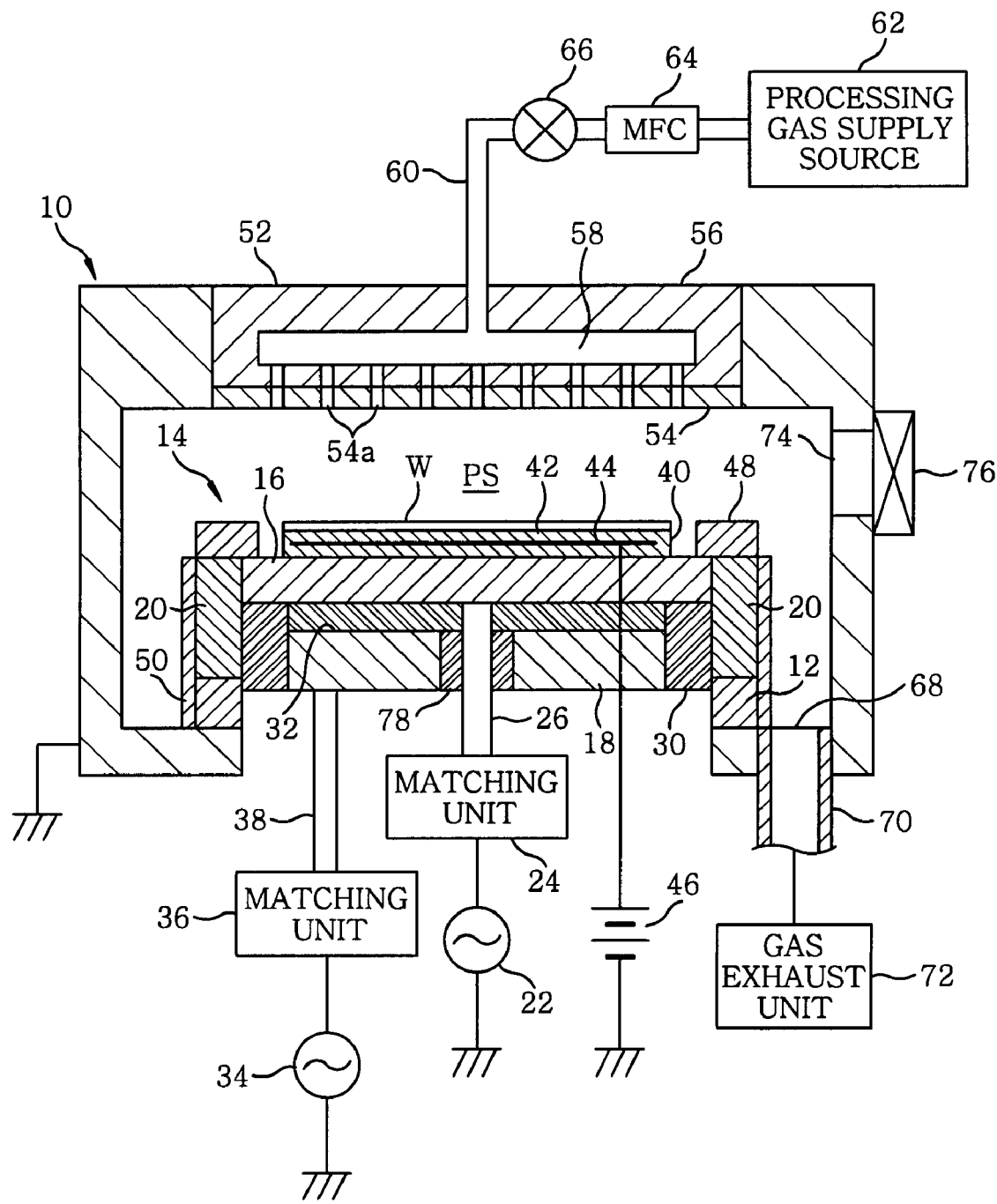
FIG. 2 sets forth a cross sectional view showing a modification of the plasma etching apparatus in accordance with the embodiment of the present invention.

For example, it is also possible to form the lower susceptor electrode 18 to have a ring shape, as illustrated in FIG. 2, so that the second high frequency power discharged into the plasma space PS from the lower susceptor electrode 18 can be made relatively weaker at the central portion of the electrode 18 in a more positive manner. Further, by forming the lower susceptor electrode 18 in the ring shape, it is possible to allow the power supply rod 26 connected to the upper susceptor electrode 16 to pass through a central opening of the lower susceptor electrode 18. In such a case, it is preferable to fill a gap between the power supply rod 26 and the inner sidewall surface of the lower susceptor electrode 18 with a cylindrical insulator 78.

Figure 3:
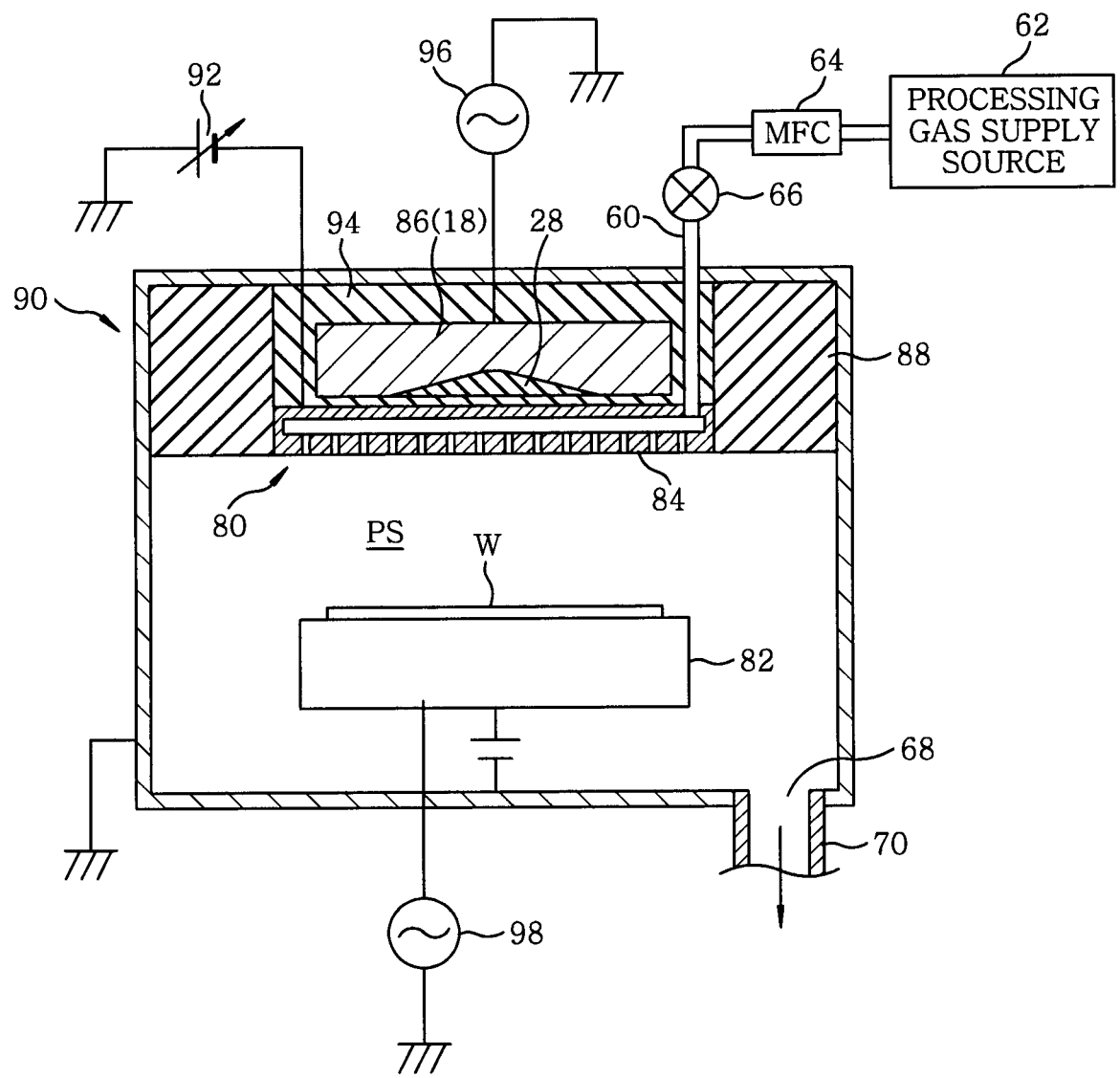
FIG. 3 presents a cross sectional view illustrating a plasma etching apparatus in accordance with another embodiment of the present invention.

Moreover, the present invention can also be applied to a plasma processing apparatus of a type in which a high frequency power applied to an upper electrode side. For example, in a second embodiment of the present invention shown in FIG. 3, the present invention is applied to an upper electrode 80 of a capacitively coupled plasma etching apparatus wherein powers of different high frequencies are respectively applied to the upper electrode 80 and a susceptor (lower electrode) 82. The upper electrode 80 includes a first upper electrode 84 disposed to face down the susceptor 82 with a plasma space PS present therebetween; and a second upper electrode 86 disposed at a rear side of the first upper electrode 84 when viewed from the plasma space PS or above the first upper electrode 84.

More specifically, the first upper electrode 84 has an electrode structure also serving as a shower head, and it is connected to a processing chamber 90 in a floating state, are electrically isolated from the chamber 90 via a ring-shaped dielectric material 88. A DC voltage is applied to the first upper electrode 84 from a variable DC power supply 92. Further, a processing gas supply source 62 is connected to the inside of the first upper electrode 84 or a gas chamber via a gas supply line 60.

The second upper electrode 86 preferably has the same electrode structure as that of the lower susceptor electrode 18 in the first embodiment, wherein the second upper electrode 86 is disposed in a reverse direction to the lower susceptor electrode 18 (that is, to face down). Further, the second upper electrode 86 is surrounded by an insulator 94 so that it is electrically isolated from the first upper electrode 84 and the chamber 90. A high frequency power of a frequency of, e.g., about 60 MHz for plasma generation is applied to the second upper electrode 86 from a high frequency power supply 96 via a matching unit (not shown).

The susceptor 82 is formed to have a columnar disk shape and it has an electrode structure for supporting a semiconductor wafer on the top surface thereof. A high frequency power of a frequency of, e.g., about 13.56 MHz for ion attraction is applied to the susceptor 82 from a high frequency power supply 98 via a matching unit (not shown).

In this plasma etching apparatus configured as described above, by the high frequency power of about 60 MHz discharged toward the plasma space PS from the second upper electrode 86, a uniform plasma can be generated in the electrode radial direction. Further, by the high frequency power of about 13.56 MHz discharged into the plasma space PS from the susceptor 82 independently of the high frequency power of about 60 MHz for plasma generation, ions can be attracted to the semiconductor wafer substantially uniformly in the electrode radial direction.

As in the first embodiment, the first upper electrode 86 may be made of a high-resistivity material such as tungsten or silicon such that it does not impede the progression of high frequency power (about 60 MHz) from the second upper electrode 86 toward the plasma space PS. Further, it is also possible to apply various functions (e.g., a function of removing plasma potentials, a function of increasing a plasma density, etc.) to, e.g., the plasma by the DC voltage supplied from the DC power supply 92.

Here, it is to be noted that the present invention is not limited to the plasma etching as described in the embodiments, but it can be applied to various other plasma processes such as plasma chemical vapor deposition (CVD), plasma oxidation, plasma nitridation, sputtering, and the like. Further, the substrate to be processed is not limited to the semiconductor wafer, but it can be a flat panel display substrate, a photo mask, a compact disk (CD) substrate, a printed substrate, or the like.

While the invention has been shown and described with respect to the embodiment, it will be understood by those skilled in the art that various changes and modifications may be made without departing from the spirit and scope of the invention as defined in the following claims.

What is claimed is:

1. A plasma processing apparatus, comprising:
   a vacuum-evacuable processing chamber;
   a first lower electrode that supports a substrate to be processed thereon in the processing chamber;
   an upper electrode disposed above the first lower electrode and facing the first lower electrode;
   a second lower electrode disposed under the first lower electrode, the second lower electrode being electrically isolated from the first lower electrode;
   a processing gas supply unit that supplies a processing gas into a space between the upper electrode and the first lower electrode;
   a first high frequency power supply unit connected to the first lower electrode that applies a first high frequency power of a first frequency to the first lower electrode; and
   a second high frequency power supply unit connected to the second lower electrode that applies a second high frequency power of a second frequency higher than the first frequency to the second lower electrode,
   wherein the first high frequency power supply unit includes a first power feeder having a ring shape electrically connected to the first lower electrode at a peripheral portion thereof,
   wherein the second high frequency power supply unit includes a second power feeder connected to the second lower electrode at a central portion thereof, and
   wherein the first lower electrode is horizontally attached to an upper portion of an inner surface of the first power feeder, and wherein the second lower electrode is disposed inside the first power feeder while being electrically isolated from the first power feeder.

2. The plasma processing apparatus of claim 1, wherein the second lower electrode is provided with a recess in a top surface thereof, and a dielectric material is filled in the recess.

3. The plasma processing apparatus of claim 2, wherein the thickness of the dielectric material is gradually reduced from a central portion of the second lower electrode toward an edge portion thereof.

4. The plasma processing apparatus of claim 3, wherein a gap between the first lower electrode and the second lower electrode is filled with an insulator.

5. The plasma processing apparatus of claim 4, wherein the first lower electrode is made of a single material to have a specific thickness.

6. The plasma processing apparatus of claim 5, wherein the first lower electrode is made of a conductive material having a high resistivity.

7. The plasma processing apparatus of claim 6, wherein an impedance of the central portion of the second lower electrode is greater than an impedance of a peripheral portion thereof.

8. The plasma processing apparatus of claim 7, wherein a resistivity of the first lower electrode is greater than a resistivity of the second lower electrode.

9. The plasma processing apparatus of claim 8, further comprising an electrostatic chuck having an electrode.

10. The plasma processing apparatus of claim 9, wherein a diameter of the second lower electrode is smaller than a diameter of the first power feeder.

11. The plasma processing apparatus of claim 1, wherein a gap between the first lower electrode and the second lower electrode is filled with an insulator.

12. The plasma processing apparatus of claim 1, wherein the first lower electrode is made of a single material to have a specific thickness.

13. The plasma processing apparatus of claim 1, wherein the first lower electrode is made of a conductive material having a high resistivity.

14. The plasma processing apparatus of claim 1, wherein an impedance of a central portion of the second lower electrode is greater than an impedance of a peripheral portion thereof.

15. The plasma processing apparatus of claim 1, wherein a resistivity of the first lower electrode is greater than a resistivity of the second lower electrode.

16. The plasma processing apparatus of claim 1, further comprising an electrostatic chuck having an electrode.

17. The plasma processing apparatus of claim 1, wherein the first high frequency power is configured for an ion attraction and the second high frequency power is configured for a plasma generation.

18. The plasma processing apparatus of claim 1, wherein a diameter of the second lower electrode is smaller than a diameter of the first power feeder.

* * * * *